(12) United States Patent
Peterson et al.

(10) Patent No.: US 7,478,232 B2
(45) Date of Patent: Jan. 13, 2009

(54) RESET DETECTOR

(75) Inventors: James F. Peterson, Clearwater, FL (US); Michael S. Arani, Pinellas Park, FL (US)

(73) Assignee: Honeywell International Inc., Morristown, NJ (US)

( * ) Notice: Subject to any disclaimer, the term of this patent is extended or adjusted under 35 U.S.C. 154(b) by 539 days.

(21) Appl. No.: 11/337,336

(22) Filed: Jan. 23, 2006

(65) Prior Publication Data

US 2007/0182466 A1    Aug. 9, 2007

(51) Int. Cl.
*G06F 9/00* (2006.01)

(52) U.S. Cl. .................................. 713/1; 326/38

(58) Field of Classification Search .................. 326/9, 326/10, 12, 37, 38, 46; 713/1
See application file for complete search history.

(56) References Cited

U.S. PATENT DOCUMENTS

| | | | |
|---|---|---|---|
| 7,089,133 B1 * | 8/2006 | Williams et al. | 702/87 |
| 7,174,473 B2 * | 2/2007 | Musumeci et al. | 713/400 |
| 2008/0030245 A1 * | 2/2008 | Elrod et al. | 327/143 |

\* cited by examiner

Primary Examiner—Don P Le
(74) Attorney, Agent, or Firm—Fogg & Powers LLC

(57) ABSTRACT

A reset detector is disclosed, which monitors the hardware reset of the subsystem(s) involved, in order to verify that the hardware reset has placed the subsystem in a correct reset state. Thus, in order to verify that an initial hardware reset has occurred, the subsystem software (e.g., during boot-up) detects the initial reset status of the reset detector, and blocks any additional reset attempts that may occur. In other words, the reset detector verifies that the subsystem hardware has been reset correctly, before the application software can proceed into an operational mode. An example reset detector circuit is disclosed, which includes a local reset signal generated by an RC delay circuit. The local reset signal is isolated from the system reset function, which allows the reset detector circuit to be initialized and reset separately from the system reset. Once the reset detector circuit is initialized, it monitors the system reset request line. Assuming that a system reset request is an active low signal, the reset detector circuit detects the "rising edge" of such a system reset signal, and latches this condition so that it can be reported to the host software. If a second or subsequent system reset request occurs, the reset detector circuit detects the "falling edge" of the system reset signal, and latches this condition for subsequent house-keeping and error reporting purposes. Also, the reset detector circuit disclosed can be designed to be re-initialized by the system software subsequent to boot-up if such a reset condition is desired. Furthermore, the RC Time Constant of the local passive reset circuit can be sized to evaluate a minimum length of time that an external reset signal must be held low.

20 Claims, 2 Drawing Sheets

RESET DETECTOR

FIELD OF THE INVENTION

The present invention relates generally to the detection of circuit resets, and more specifically, but not exclusively, to a reset detector circuit that can be used for systems having high reliability requirements.

BACKGROUND OF THE INVENTION

An important requirement imposed on modem electronic systems having high reliability requirements (e.g., systems performing real-time and/or mission-critical operations) is that the systems hardware (e.g., digital logic circuits) must be correctly reset and initialized. In this regard, it is critical that the system designers ensure that the systems' hardware is reset or initialized correctly at power on, and subsequently is not reset again. For example, in a missile system, at system startup and prior to launch, the missile system's mission computer should verify that the systems' digital logic circuits have been reset and properly initialized. Once the mission computer verifies that such an initialization reset has occurred, the mission computer could block any subsequent reset attempts. Thus, in an ideal design, the system's software should be able to verify that an initial reset has occurred before blocking any subsequent reset attempts. However, a problem with the existing system designs is that it is possible for the software to proceed into an application mode without having properly verified that an initial reset has occurred. Consequently, the existing system designs cannot guarantee the correct initialization and operation of the digital logic circuitry or hardware involved.

For example, a reset detector circuit could be used to detect a reset and verify to application software running on a system computer that such a reset has occurred. The application software could perform this verification before proceeding with "normal" operations, and halt these operations if such a reset has not occurred. In some existing applications, in an attempt to ensure that the hardware (logic circuitry) is correctly reset and subsequent resets do not occur, the system designers have imposed a time requirement so that once the hardware has been reset initially, it must be held in a reset mode for a predetermined length of time. Notably, once a power-on reset has occurred for the hardware in a real-time, mission-critical system (e.g., spacecraft, missile, aircraft, etc.), this hardware must not be reset again, or the system's operations could be interrupted, halted and result in a mission failure. However, notwithstanding the benefits of prolonging the initial reset mode for a predetermined period of time, a problem with the existing circuitry and associated application software is that they are still incapable of blocking all subsequent reset requests from occurring. For example, noise generated in a system can cause a reset line to toggle unexpectedly (e.g., noise caused by booster separation, faulty circuitry, or other localized noise in the circuitry involved) after the prolonged reset mode is terminated. Consequently, a pressing need exists for a reset detector circuit that can verify that an initial hardware reset has occurred, that it was asserted a minimum length of time, allow no other resets to occur, and detect (e.g., for monitoring and reporting purposes) if a subsequent reset request is made. As described in detail below, the present invention provides such a reset detector circuit, which resolves the above-described reset problems and other similar problems.

SUMMARY OF THE INVENTION

The present invention provides a reset detector, which monitors the hardware reset of the subsystem(s) involved, in order to verify that the hardware reset has placed the subsystem in a correct reset state. Thus, in order to verify that an initial hardware reset has occurred, the subsystem software (e.g., during boot-up) detects the initial reset status of the reset detector, and blocks any additional reset attempts that may occur. In other words, the reset detector verifies that the subsystem hardware has been reset correctly, before the application software can proceed into an operational mode. In accordance with a preferred embodiment of the present invention, a reset detector circuit is provided, which includes a local reset signal generated by a passive reset circuit. The local reset signal is isolated from the system reset function, which allows the reset detector circuit to be initialized and reset separately from the system reset. Once the reset detector circuit is initialized, it monitors the system reset request line. Assuming that a system reset request is an active low signal, the reset detector circuit detects the "rising edge" of such a system reset signal, and latches this condition so that it can be reported to the host software. If a second or subsequent system reset request occurs, the reset detector circuit first blocks it from propagating, and reports the occurrence by detecting the "falling edge" of the system reset signal, and latching this condition for subsequent house-keeping and error reporting purposes. Also, in accordance with a second embodiment of the present invention, the reset detector circuit can be re-initialized by the system software subsequent to boot-up, if such a reset condition is desired.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
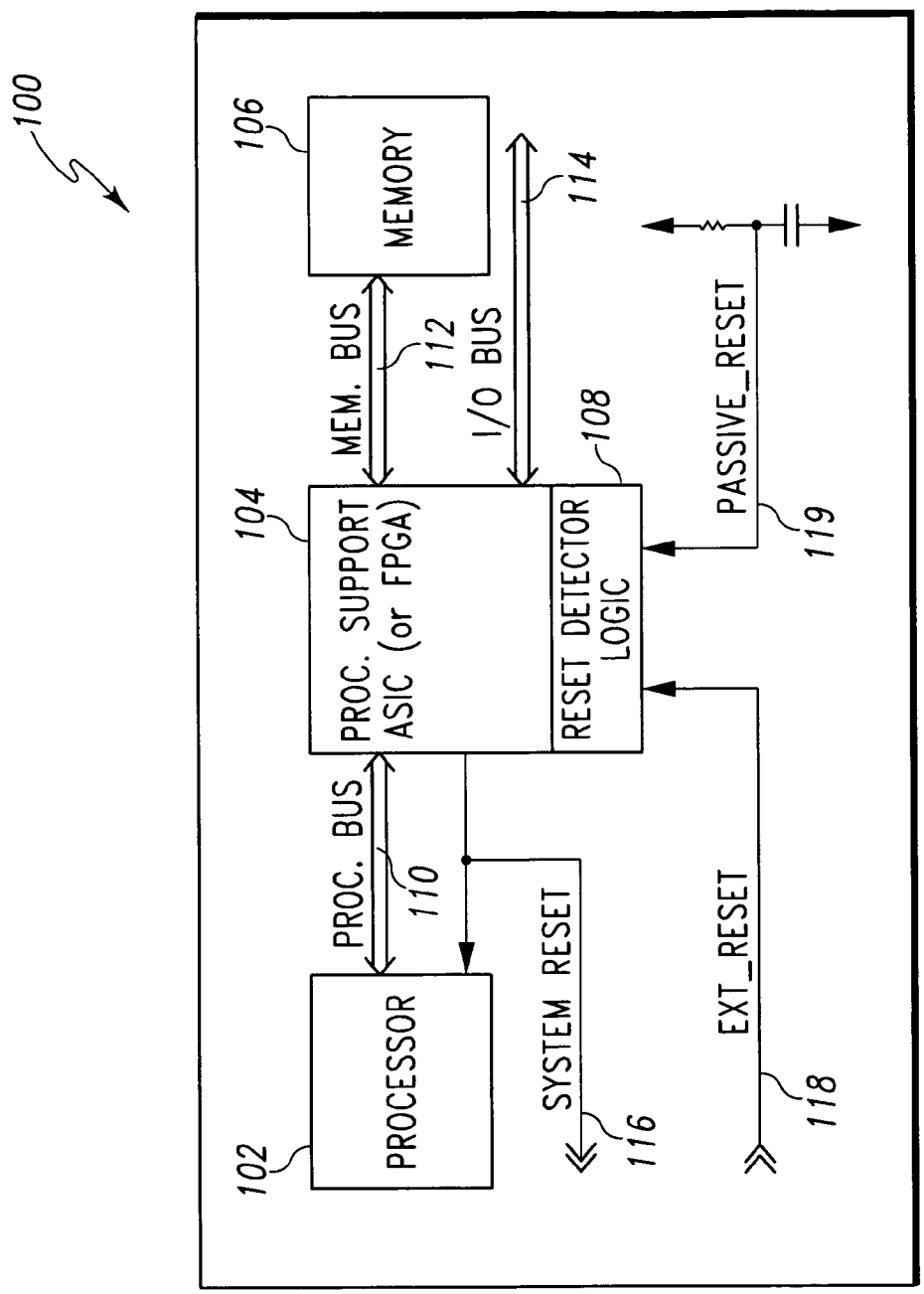
FIG. 1 depicts a block diagram of a computer subsystem that can be used, for example, in a high reliability, real-time, mission-critical system, in accordance with a preferred embodiment of the present invention.

With reference now to the figures, FIG. 1 depicts a block diagram of a computer subsystem 100 that can be used, for example, in a high reliability, real-time, mission-critical system (e.g., missile system, spacecraft system, aircraft system, etc.), in accordance with a preferred embodiment of the present invention. For this example embodiment, computer subsystem 100 includes a processor unit 102, a processor support unit 104, and a memory unit 106. For example, processor unit 102 can be arranged as a single digital processor or plurality of digital processors connected to a data communications bus (e.g., processor bus) 110. Processor bus 110 provides a data communications interface between processor unit 102 and processor support unit 104. Processor support unit 104, which can be implemented as an Application-Specific Integrated Circuit (ASIC) or Field-Programmable Gate Array (FPGA), is designed to perform auxiliary data processing/communications functions in support of processor unit 102. For this example embodiment, processor support unit 104 also includes reset detector logic circuit 108, which will be described in detail below.

Processor support unit 104 is connected to local memory unit 106 (e.g., RAM, ROM, etc.) by a second data communications bus (e.g., memory bus) 112, which can be coupled to a local memory controller/cache. Thus, memory bus 112 provides a data communications interface between processor support unit 104 and memory unit 106. Essentially, a plurality of machine instructions can be stored in memory unit 106, retrieved by processor unit 102 via processor support unit 104, and operated on by processing unit 102. Processor support unit 104 also includes an Input/Output (I/O) bus bridge (not shown), which provides a data communications interface between processing unit 102 and an I/O bus 114. Thus, processing unit 102 can receive, retrieve and/or send data from/to an external circuit, subsystem or application via processor support unit 104 and I/O bus 114.

Three resets are shown in the example embodiment of FIG. 1. Ext_Reset 118 is the connection for the unqualified external reset command that the reset detector logic evaluates. Passive_Reset 119 is the connection for the passively generated reset circuit that is used to initialize the reset detector logic circuitry. System_Reset 116 is the connection for the qualified reset that the reset detector logic allows to be distributed.

As described earlier, in order to operate reliably, the reset detector logic circuit 108 is initialized in a known and predetermined state independently of the system reset. Thus, for this example embodiment, a local reset signal (e.g., Passive_Reset) applied at connection 119 is provided to initialize the reset detector logic circuit 108. The generation of this local reset signal is described in detail below. In any event, the generation of the Passive_Reset signal at connection 119 is designed so that it is asserted for a time period that is long enough to correctly reset or initialize the reset detector logic circuit 108, but this time period is also selected to be short enough to ensure that the reset detector logic circuit 108 is able to monitor for an Ext_Reset signal at connection 118 after the initial Passive_Reset has occurred.

Essentially, for this example embodiment, processor support unit 104 distributes a (qualified) system reset signal at connection 116 to subsystem 100 subsequent to the occurrence of an Ext_Reset signal at connection 118. Once out of reset, the processor unit 102 begins to execute software instructions retrieved from memory unit 106 (e.g., ROM). The boot-up subset of software instructions can include suitable coding to support the Status and Configuration of the reset detector logic circuit 108. One step of these instructions can be to determine if a correct reset has occurred (Status). If a correct reset is not determined to have occurred, then the software instructions would terminate operations as the next step. Otherwise, if a correct reset has occurred, then as the next step, the software instructions would block the occurrence of any additional resets (Configuration). Also, the software instructions would proceed to execute the additional boot-up subroutines and application routines involved, while continuing to monitor the Ext_Reset connection 118 for any unexpected reset requests or attempts that occur. If any such unexpected reset requests or attempts are received at connection 118, the software can consider these requests as errors that can be reported out with one or more suitable messages for housekeeping and maintenance purposes.

Figure 2:
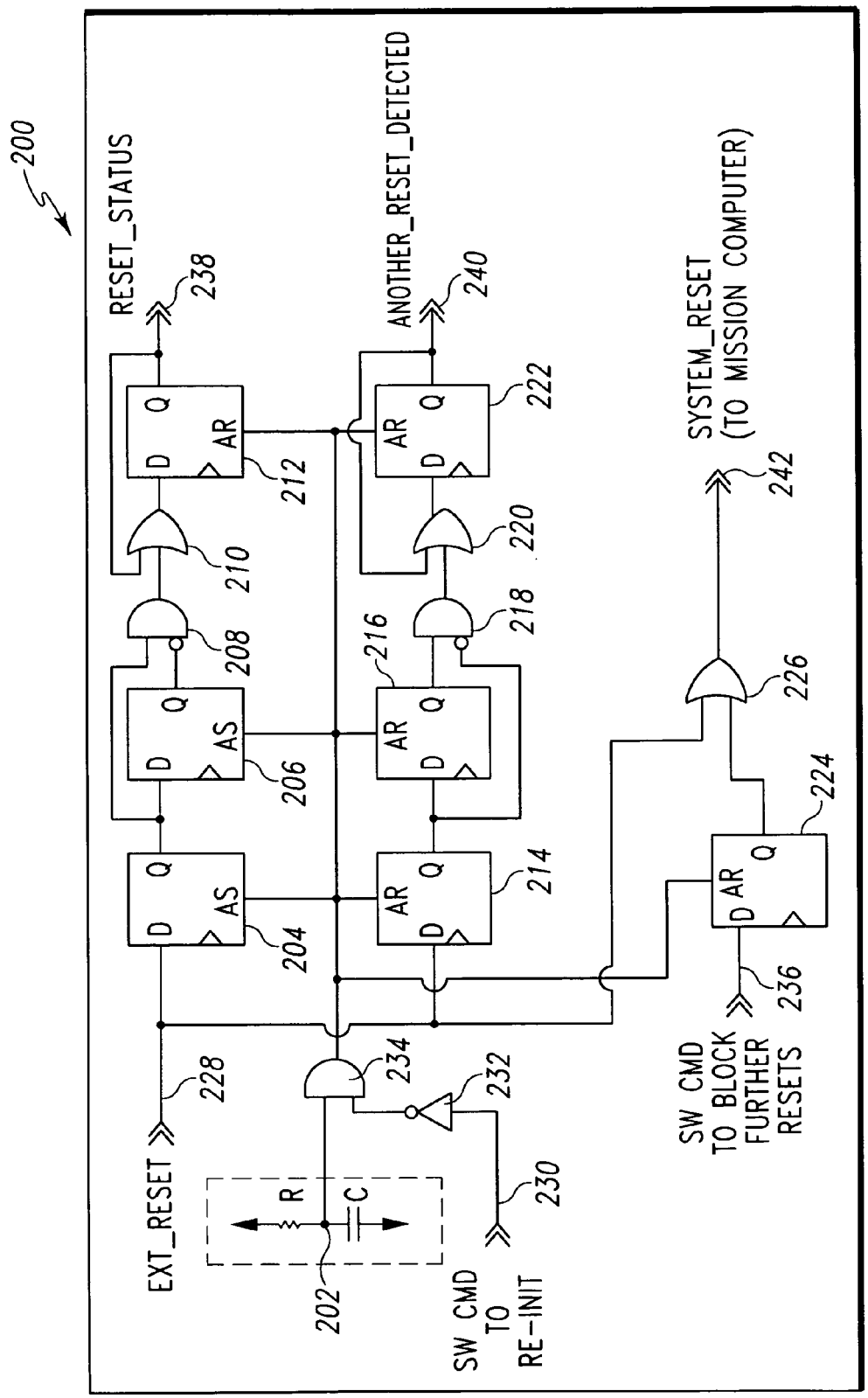
FIG. 2 depicts a schematic diagram of an example reset detector circuit that can be used to implement the reset detector logic circuit shown in FIG. 1, in accordance with a preferred embodiment of the present invention.

FIG. 2 depicts a schematic diagram of an example reset detector circuit 200 that can be used to implement reset detector logic circuit 108 in FIG. 1, in accordance with a preferred embodiment of the present invention. For this example embodiment, reset detector circuit 200 includes a first plurality of D flip-flops 204, 206 and 212. Flip-flops 204, 206 and 212 are configured as an edge detector circuit. An input connection labeled Ext_Reset 228 is coupled to the D input of flip-flop 204, and the Q output of flip-flop 204 is coupled to the D input of flip-flop 206 and a first input of an AND gate 208. The Q output of flip-flop 206 is coupled to an inverted second input of AND gate 208. The output of AND gate 208 is coupled to a first input of an OR gate 210, and the output of OR gate 210 is coupled to the D input of flip-flop 212. The Q output of flip-flop 212 is coupled to the second input of OR gate 210 and also to an output connection labeled Reset_Status 238. Essentially, flip-flop 212 latches logic "1" at its Q data storage output if the rising edge of a signal is presented at the D input of flip-flop 204 and flip-flop 212. This latch circuit at OR gate 210 and flip-flop 212 will hold a logic "1" here until either power is cycled or a reinitialize command is issued by software.

For this example embodiment, reset detector circuit 200 also includes a second plurality of D flip-flops 214, 216 and 222. Flip-flops 214, 216 and 222 are also configured as an edge detector circuit. The Ext_Reset input connection 228 is also coupled to the D input of flip-flop 214, and the Q output of flip-flop 214 is coupled to the D input of flip-flop 216 and an inverted input of an AND gate 218. The Q output of flip-flop 216 is coupled to the non-inverted second input of AND gate 218. The output of AND gate 218 is coupled to a first input of an OR gate 220, and the output of OR gate 220 is coupled to the D input of flip-flop 222. The Q output of flip-flop 222 is coupled to the second input of OR gate 220 and also to an output connection labeled Another_Reset_Detected 240. Essentially, flip-flop 222 latches logic "1" at its Q data storage output if the falling edge of a signal is presented at the D input of flip-flop 214 (e.g., a falling edge at Ext_Reset means that a second reset has occurred). The flip-flop 222 latches logic "1" at its Q output if the falling edge of a signal is presented at the D input of flip-flop 214, and holds a logic "1" here until either power is cycled or a reinitialize command is issued by software.

Additionally, for this example embodiment, reset detector circuit 200 includes an RC reset circuit 202 coupled to an input of an AND gate 234. An input connection (Software command to re-initialize reset detector circuit) 230 is coupled to the input of an inverter 232, and the output of inverter 232 is coupled to the second input of AND gate 234. A command signal presented at connection 230 can be provided by the host system's computer. The output of AND gate 234 is coupled to the asynchronous set (AS) inputs of flip-flops 204, 206, and the asynchronous reset (AR) inputs of flip-flops 212, 214, 216, 222 and an additional D flip-flop 224. An input connection (Software command to block further resets) 236 is coupled to the D input of flip-flop 224, and the Q output of flip-flop 224 is coupled to an input of an OR gate 226. The second input of OR gate 226 is coupled to the Ext_Reset connection 228, and the output of OR gate 226 is coupled to an output connection labeled System-Reset 242. For this example embodiment, Ext-Reset connection 228 in FIG. 2 represents Ext_Reset connection 118 shown in FIG. 1, and System_Reset connection 242 in FIG. 2 represents the (qualified) System-Reset connection 116 shown in FIG. 1.

In operation, in accordance with principles of the present invention, all of the flip-flops shown in reset detector circuit 200 are reset initially by the passive RC reset circuit 202, which is preferably located externally to reset detector circuit 200. In the context of FIG. 1, the passive reset circuit 202 would be located externally to reset detector logic circuit 108 and processor support unit 104. The reset signal generated at the Passive_Reset connection 202 (e.g., at power up) is the reset signal used to initialize reset detector circuit 200 (note that two of these flip-flops are actually initialized to logic "1" with this reset signal). For this example embodiment, it may be assumed that all valid reset signals are provided as active low signals, and all of the flip-flops shown in FIG. 2 are clocked by a common clock signal (not shown). However, it should be understood that all valid reset signals could also be provided as active high signals, because this is a design preference and not intended as an architectural limitation to be imposed on the present invention.

Preferably, in order to ensure that reset detector circuit 200 is capable of detecting a reset event at Ext_Reset connection 228, the time period resulting from the value of the RC time constant selected for the passive reset circuit 202 needs to terminate at least 3 clock periods prior to the rising edge of an external reset signal presented at connection 228. As such, the value of the RC time constant of reset circuit 202 may be selected so that a predetermined reset time requirement can be verified. For example, if the mission subsystem involved requires the use of a low signal on Ext_Reset for at least 100 ms, then the signal provided at Ext_Reset connection 228 can be designed with a low signal for 150 ms. In this case, the RC time constant of reset circuit 202 can be adjusted so that the flip-flops shown in FIG. 2 can terminate the initial reset mode in 100 ms. Thus, if an Ext_Reset signal was asserted, but negated, at connection 228 prior to the termination of the time period determined by the passive RC reset 202, such a reset signal would not be detected by reset detector circuit 200, and the application software could assume that this reset request is a reset error condition.

If a suitable reset signal is presented at Ext_Reset connection 228 (e.g., "0" at power-up), and held at least three clocks longer than the RC Time Constant of the Passive_Reset circuit, the three flip-flops 204, 206 and 212 function to detect the rising edge of this signal. The third flip-flop 212 latches and stores this condition as logic "1" at its Q output and also at Reset_Status connection 238. If the signal at Reset_Status connection 238 is logic "1", then it is assumed that a correct reset request has occurred. Consequently, the application software can monitor Reset_Status connection 238 and determine whether or not a correct initialization reset has occurred.

If the falling edge of a signal is presented at Ext_Reset connection 228, then it may be assumed that a second (or subsequent) reset request has occurred. In this case, the three flip-flops 214, 216 and 222 are provided to detect the falling edge of a signal presented at Ext_Reset connection 228. The third flip-flop 222 latches and stores this condition at its Q output and also at connection 240. If the signal stored at connection 240 is a logic "1", then the application software monitoring this connection would determine that a second (or subsequent) reset request has occurred, and can report this condition to a house-keeping or maintenance application.

For this example embodiment, the flip-flop 224 and OR gate 226 are provided to enable the application software from the mission computer (via a suitable command signal presented at connection 236) to block a second or subsequent reset request signal presented at Ext_Reset connection 228 from asserting a reset signal at System_Reset connection 242. Notably, the passive RC reset circuit 202 enables reset detector circuit 200 always to be correctly initialized at power up. However, if desired, as a second example embodiment, the application software can also reinitialize reset detector circuit 200 by providing a suitable signal at connection 230. The inverter 232 and the AND gate 234 are provided so that the application software can reinitialize reset detector circuit 200 without having to toggle the circuit power.

It is important to note that while the present invention has been described in the context of a fully functioning reset detector, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular reset detector.

The description of the present invention has been presented for purposes of illustration and description, and is not intended to be exhaustive or limited to the invention in the form disclosed. Many modifications and variations will be apparent to those of ordinary skill in the art. These embodiments were chosen and described in order to best explain the principles of the invention, the practical application, and to enable others of ordinary skill in the art to understand the invention for various embodiments with various modifications as are suited to the particular use contemplated.

What is claimed is:

1. A reset detector, comprising:
    a passive reset unit; and
    a plurality of signal detector units coupled to said passive reset unit, a first signal detector unit of said plurality of signal detector units operable to detect a first reset request signal, a second signal detector unit of said plurality of signal detector units operable to detect a second reset request signal, and said passive reset unit operable to block a detection of said second reset request signal.

2. The reset detector of claim 1, wherein said passive reset unit is operable to block said detection of said second reset request signal for a predetermined time period associated with a time of occurrence of said first reset request signal.

3. The reset detector of claim 1, wherein said passive reset unit comprises an RC circuit.

4. The reset detector of claim 1, wherein said passive reset unit is operable to block said detection of said second reset request signal for a predetermined time period associated with a time of occurrence of said first reset request signal, and said predetermined time period is associated with a time constant of an RC delay.

5. The reset detector of claim 1, wherein said plurality of signal detector units comprises a plurality of D flip-flops.

6. The reset detector of claim 1, wherein said plurality of signal detector units comprises a plurality of signal edge detectors.

7. The reset detector circuit of claim 1, wherein said first reset request signal comprises a rising edge of a signal.

8. The reset detector circuit of claim 1, wherein said second reset request signal comprises a falling edge of a signal.

9. The reset detector circuit of claim 1, wherein said first request signal comprises a rising edge of a reset request signal, and at least one signal detector unit of said plurality of signal detector units comprises a flip-flop operable to latch a logic "1" representing a valid initial reset request.

10. The reset detector circuit of claim 1, wherein said second request signal comprises a falling edge of a reset request signal, and at least one signal detector unit of said plurality of signal detector units comprises a flip-flop operable to latch a logic "1" representing an invalid initial reset request.

11. The reset detector circuit of claim 1, wherein said reset detector circuit is operable to perform a reset operation responsive to a first reset request, block said performance of said reset operation responsive to a second reset request, and output an indication of said second reset request.

12. A reset detector, comprising:
   means for detecting a first reset request signal;
   means for detecting a second reset request signal; and
   means for blocking a detection of said second reset request signal.

13. The reset detector of claim 12, wherein said means for blocking further comprises:
   means for blocking a detection of said second reset request signal, responsive to a software command.

14. The reset detector of claim 12, further comprising:
   an RC circuit operable to initialize or reset the reset detector logic, and evaluate a minimum length of time for an assertion of an Ext_Reset.

15. The reset detector of claim 12, wherein said means for detecting said first reset request signal comprises a first plurality of D flip-flops, and said means for detecting said second reset request signal comprises a second plurality of D flip-flops.

16. The reset detector of claim 12, wherein said means for detecting said first reset request signal comprises a first plurality of signal edge detectors, and said means for detecting said second reset request signal comprises a second plurality of signal edge detectors.

17. A method for detecting a reset request, comprising the steps of:
   detecting a first reset request signal;
   performing a first reset responsive to said first reset request signal;
   detecting a second reset request signal; and
   blocking performance of a reset responsive to said second reset request signal.

18. The method of claim 17, wherein the blocking step further comprises the step of:
   blocking performance for a predetermined time period associated with a time of occurrence of said first reset request signal.

19. A computer program product, comprising:
   a computer-usable medium having computer-readable code embodied therein for configuring a computer processor, the computer program product comprising:
   a first executable computer-readable code configured to cause a computer processor to detect a first reset request signal;
   a second executable computer-readable code configured to cause a computer processor to perform a first reset responsive to said first reset request signal;
   a third executable computer-readable code configured to cause a computer processor to detect a second reset request signal; and
   a fourth executable computer-readable code configured to cause a computer processor to block performance of a reset responsive to said second reset request signal.

20. The computer program product of claim 19, further comprising:
   a fifth executable computer-readable code configured to cause a computer processor to block performance for a predetermined time period associated with a time of occurrence of said first reset request signal.

* * * * *